United States Patent
Lee et al.

(10) Patent No.: US 11,262,613 B2
(45) Date of Patent: *Mar. 1, 2022

(54) FLEXIBLE DISPLAY APPARATUS

(71) Applicant: Samsung Display Co., Ltd., Yongin-si (KR)

(72) Inventors: Heeyoung Lee, Suwon-si (KR); Eunmi Seo, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/552,725

(22) Filed: Aug. 27, 2019

(65) Prior Publication Data

US 2019/0384111 A1    Dec. 19, 2019

Related U.S. Application Data

(63) Continuation of application No. 15/646,044, filed on Jul. 10, 2017, now Pat. No. 10,401,675.

(30) Foreign Application Priority Data

Nov. 28, 2016    (KR) ......................... 10-2016-0159639

(51) Int. Cl.
    *G02F 1/1335*    (2006.01)
    *G02F 1/13363*    (2006.01)
    (Continued)

(52) U.S. Cl.
    CPC .... *G02F 1/133528* (2013.01); *G02F 1/13363* (2013.01); *G02F 1/133305* (2013.01);
    (Continued)

(58) Field of Classification Search
    CPC .. G02B 5/3016; G02B 5/3083; G02B 5/3033; G02B 6/0056; G02B 6/02109;
    (Continued)

(56) References Cited

U.S. PATENT DOCUMENTS 8,373,340 B2    2/2013 Lee et al.
9,423,915 B2    8/2016 Kang et al.
(Continued)

FOREIGN PATENT DOCUMENTS

CN    101847347    9/2010
CN    104345975    2/2015
(Continued)

OTHER PUBLICATIONS

Grant of Patent dated Mar. 27, 2019, in Korean Patent Application No. 10-2016-0159639.
(Continued)

*Primary Examiner* — Shan Liu
(74) *Attorney, Agent, or Firm* — H.C. Park & Associates, PLC

(57) ABSTRACT

A flexible display apparatus includes a bending area and a non-bending area. The flexible display apparatus further includes a display panel and a polarizing structure disposed on the display panel. The polarizing structure includes a λ/4 phase retardation layer, a linear polarizer disposed on the λ/4 phase retardation layer, and a first adhesive structure disposed between the λ/4 phase retardation layer and the linear polarizer. The linear polarizer includes a stretched polymer film. The first adhesive structure is an adhesive layer with a glass transition temperature that is greater than or equal to 40° C. and less than or equal to 150° C. Accordingly, deformation of the λ/4 phase retardation layer may be prevented or reduced when the flexible display apparatus is folded or bent, thereby improving display quality.

18 Claims, 10 Drawing Sheets

(51) Int. Cl.
  *G02F 1/1333* (2006.01)
  *G02B 5/30* (2006.01)
  *H01L 51/52* (2006.01)
  *H01L 27/32* (2006.01)
  *H01L 51/00* (2006.01)

(52) U.S. Cl.
  CPC .......... *G02B 5/3016* (2013.01); *G02B 5/3083* (2013.01); *G02F 2202/28* (2013.01); *H01L 27/323* (2013.01); *H01L 51/0097* (2013.01); *H01L 51/5281* (2013.01); *H01L 2251/5338* (2013.01)

(58) Field of Classification Search
  CPC ............. H01L 51/5281; H01L 51/0097; H01L 27/323; H01L 2251/5338; H01L 51/5293; G02F 1/0311; G02F 1/116; G02F 1/1335; G02F 1/133528; G02F 1/133536; G02F 1/13362; G02F 1/133533; G02F 2001/133531; G02F 2001/133521; G02F 2001/13356; G02F 2001/133538; G02F 2001/133541; G02F 2001/133543; G02F 2001/133545; G02F 2001/133548; G02F 2001/13355; G02F 2001/133562; G02F 2001/133567; G02F 2203/16; G02F 1/1347; G02F 1/13471; G02F 1/133305; G02F 1/13363; G02F 2202/28; B29D 11/00644; B32B 17/10458; B32B 2307/42; H01R 12/7005; H04B 10/532; G01J 5/0825; G03F 9/7065; G01R 33/3678; C09K 19/0208
  USPC ............................................. 349/96–103, 194
  See application file for complete search history.

(56) References Cited

U.S. PATENT DOCUMENTS

| | | | |
|---|---|---|---|
| 10,401,675 B2* | 9/2019 | Lee | G02F 1/13363 |
| 2005/0062906 A1 | 3/2005 | Ishizaki | |
| 2005/0264735 A1 | 12/2005 | Tago et al. | |
| 2007/0115409 A1 | 5/2007 | Oka et al. | |
| 2007/0127130 A1* | 6/2007 | Ushino | G02B 5/3083 359/625 |
| 2008/0297898 A1 | 12/2008 | Martin | |
| 2009/0027596 A1 | 1/2009 | Toyama et al. | |
| 2010/0283946 A1 | 11/2010 | Ueda et al. | |
| 2013/0250196 A1 | 9/2013 | Seo et al. | |
| 2014/0037843 A1 | 2/2014 | Satake et al. | |
| 2014/0204317 A1 | 7/2014 | Huh et al. | |
| 2014/0293420 A1 | 10/2014 | Ko et al. | |
| 2015/0049281 A1 | 2/2015 | Lee et al. | |
| 2015/0064367 A1 | 3/2015 | Choi et al. | |
| 2015/0315431 A1 | 11/2015 | Yu et al. | |
| 2016/0291224 A1 | 10/2016 | Ahn et al. | |
| 2017/0219756 A1 | 8/2017 | Lee et al. | |
| 2017/0278902 A1 | 9/2017 | Choi et al. | |
| 2017/0315399 A1 | 11/2017 | Kwon et al. | |
| 2018/0095211 A1 | 4/2018 | Lee et al. | |
| 2018/0114950 A1 | 4/2018 | Lee et al. | |
| 2019/0106599 A1* | 4/2019 | Okamoto | C09J 4/00 |

FOREIGN PATENT DOCUMENTS

| | | |
|---|---|---|
| CN | 107230433 | 10/2017 |
| CN | 107978621 | 5/2018 |
| JP | 2014-071380 | 4/2014 |
| JP | 2015-011094 | 1/2015 |
| JP | 2015-040904 | 3/2015 |
| JP | 2015-040905 | 3/2015 |
| JP | 2016136181 | 7/2016 |
| KR | 10-2014-0103025 | 8/2014 |
| KR | 20140118595 A | 10/2014 |
| KR | 101569206 | 11/2015 |
| KR | 10-2016-0005288 | 1/2016 |
| KR | 10-1613765 | 4/2016 |
| KR | 10-2016-0049030 | 5/2016 |
| KR | 10-2016-0055431 | 5/2016 |
| KR | 10-2016-0102408 | 8/2016 |
| KR | 10-2016-0116900 | 10/2016 |
| KR | 10-2017-0090564 | 8/2017 |
| KR | 10-2017-0113762 | 10/2017 |
| KR | 10-2018-0036864 | 4/2018 |
| WO | 2014-126403 | 8/2014 |

OTHER PUBLICATIONS

Office Action dated Nov. 20, 2018, in Korean Patent Application No. 10-2016-0159639.
Notice of Allowance dated Apr. 26, 2019, in U.S. Appl. No. 15/646,044.
Final Office Action dated Feb. 7, 2019, in U.S. Appl. No. 15/646,044.
Non-Final Office Action dated Aug. 15, 2018, in U.S. Appl. No. 15/646,044.
English Translation of JP 2015011094 A, Title: Polarization Film, Manufacturing Method Thereof, Optical Film and Image Display Unit; Author: Inui Kunihiro; Muraokaatsushi; Date of Publication Jan. 19, 2015 (Year: 2015).
English Translation of KR 1020160055431 A; Title: Polarizing Film and Display Device Having the Same; Author: Hong Jin Woo, Park Sung Jin; Date of Publication: May 18, 2016 (Year: 2016).
English Translation of JP 2014071380 A; Title: Transfer Body for Optical Film, Optical Film, Image Display Device, and Production Method of Optical Film; Author: Kato Kei; Date of Publication: Apr. 21, 2014 (Year: 2014).
English Translation of JP 2015040904 A; Title: Optical Film, Image Display Device, Transfer Body for Optical Film, Manufacturing Method of Optical Film, and Manufacturing Method of Transfer Body for Optical Film; Author: Kato Kei; Date of Publication: Mar. 2, 2015 (Year: 2015).
English Translation of JP 2015040905 A; Title: Optical Film, Image Display Device, Transfer Body for Optical Film, Manufacturing Method of Optical Film, and Manufacturing Method of Transfer Body for Optical Film; Author: Kato Kei; Date of Publication: Mar. 2, 2015 (Year: 2015).
Office Action for Chinese Patent Application No. 201711063042 dated Nov. 9, 2020.

\* cited by examiner

FLEXIBLE DISPLAY APPARATUS

CROSS-REFERENCE TO RELATED APPLICATION

This application is a Continuation of U.S. patent application Ser. No. 15/646,044, filed Jul. 10, 2017, which claims priority from and the benefit of Korean Patent Application No. 10-2016-0159639, filed Nov. 28, 2016, each of which is hereby incorporated by reference for all purposes as if fully set forth herein.

BACKGROUND

Field

Exemplary embodiments relate to a display apparatus including a polarizing member. More particularly, exemplary embodiments relate to a flexible display apparatus including a polarizing member, the deformation of which is minimized (or at least reduced) when the flexible display apparatus is bent, folded, twisted, or otherwise deformed.

Discussion

Various display apparatuses are being developed that can be used for multimedia devices, such as televisions, mobile phones, notebook computers, tablets, navigation devices, game machines, and the like. Further effort has been devoted to the development of flexible display apparatuses that are capable of having their shape variously changed, such as through being bent, being folded, being twisted, or otherwise being deformed. When the shape of such a flexible display apparatus is changed, stress is applied to various members constituting the display apparatus, and, as such, deformation of the various members of the display apparatus may occur. This deformation may cause, at least in part, issues that degrade display quality.

The above information disclosed in this section is only for enhancement of an understanding of the background of the inventive concepts, and, therefore, it may contain information that does not form prior art already known to a person of ordinary skill in the art.

SUMMARY

One or more exemplary embodiments provide a flexible display apparatus that is capable of improving display quality by providing an adhesive member having a high glass transition temperature between optical functional layers included in a polarizing member so as to minimize (or at least reduce) deformation of the polarizing member resulting from various usage forms of the flexible display apparatus.

Additional aspects will be set forth in the detailed description which follows, and, in part, will be apparent from the disclosure, or may be learned by practice of the inventive concepts.

According to one or more exemplary embodiments, a flexible display apparatus includes a bending area and a non-bending area. The flexible display apparatus further includes a display panel and a polarizing structure disposed on the display panel. The polarizing structure includes a λ/4 phase retardation layer, a linear polarizer disposed on the λ/4 phase retardation layer, and a first adhesive structure disposed between the λ/4 phase retardation layer and the linear polarizer. The linear polarizer includes a stretched polymer film. The first adhesive structure is an adhesive layer with a glass transition temperature that is greater than or equal to 40° C. and less than or equal to 150° C. Accordingly, deformation of the λ/4 phase retardation layer may be prevented or reduced when the flexible display apparatus is folded or bent, thereby improving display quality.

According to one or more exemplary embodiments, a flexible display apparatus includes a display panel and a polarizing structure disposed on the display panel. The display panel includes a bending area that is transformable into a bent shape or has a bent shape with respect to a bending axis extending in one direction. The polarizing structure includes: a λ/4 phase retardation layer including a liquid crystal coating layer; a first adhesive structure disposed on the λ/4 phase retardation layer, the first adhesive structure being an adhesive layer with a glass transition temperature that is greater than or equal to 40° C. and less than or equal to 150° C.; and a linear polarizer disposed on the first adhesive structure, the linear polarizer including a stretched polymer film. Accordingly, deformation of the λ/4 phase retardation layer may be prevented or reduced when the flexible display apparatus is folded or bent, thereby improving display quality.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1A:
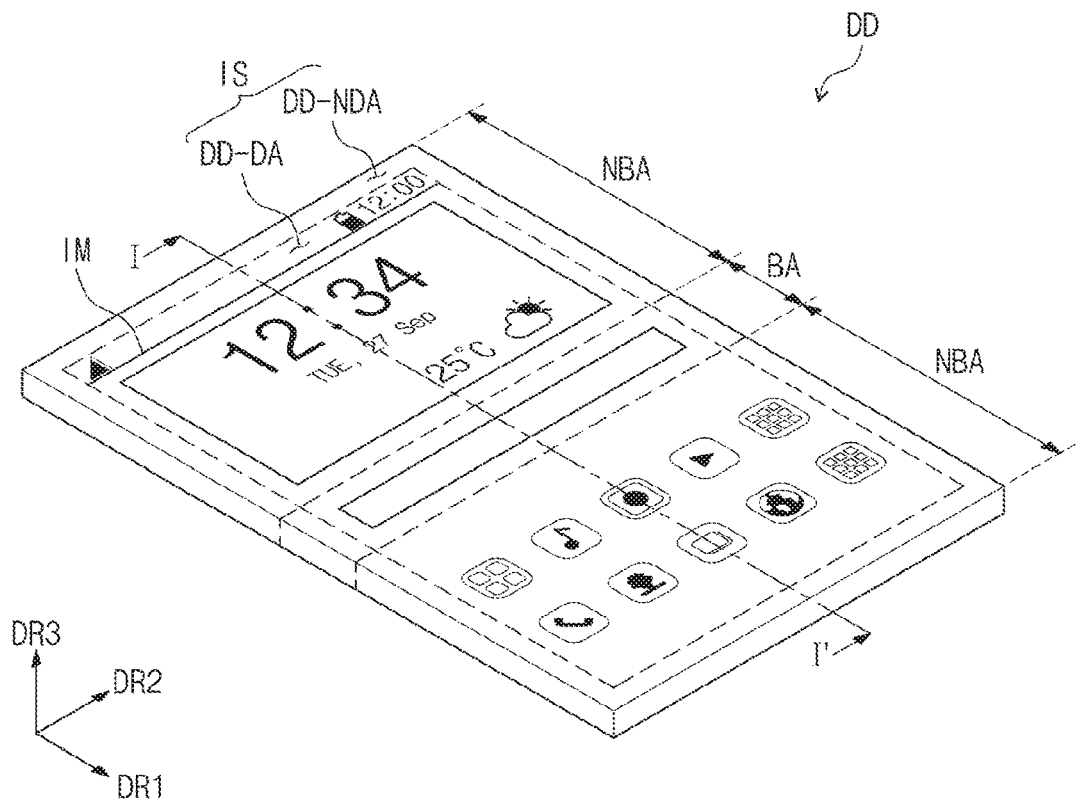
FIG. 1A is a perspective view illustrating a flexible display apparatus in an unbent state according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the 2o exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
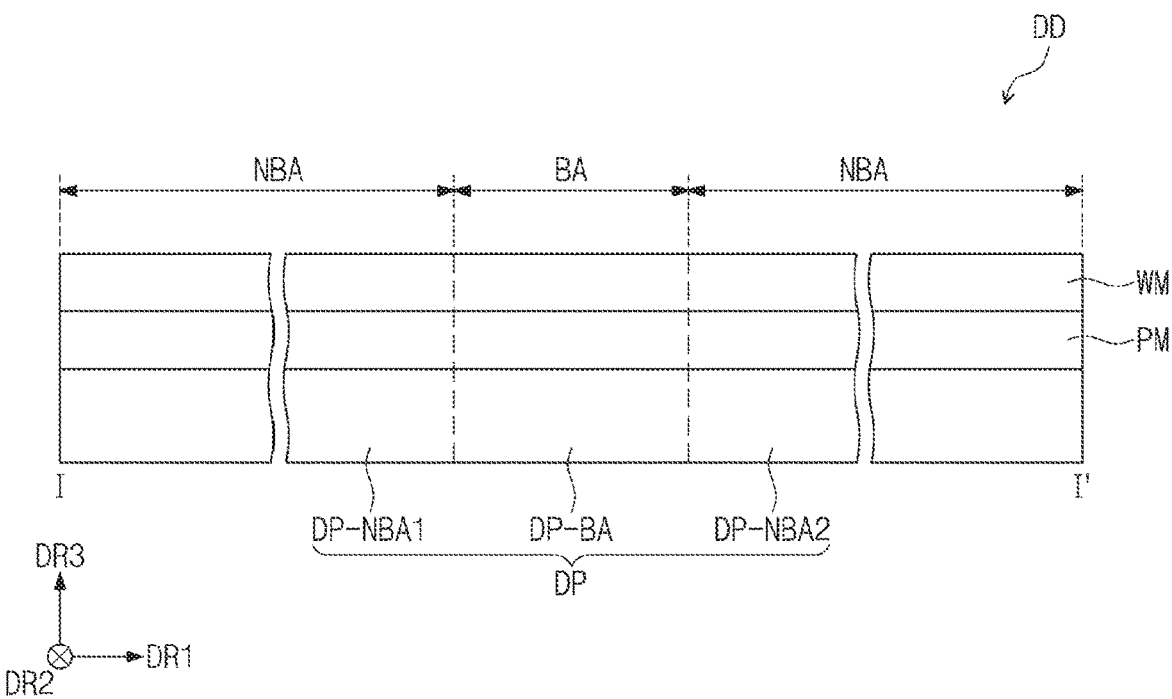
FIG. 1B is a cross-sectional view of the flexible display device of FIG. 1A taken along sectional line I-I' according to one or more exemplary embodiments.
Figure 2A:
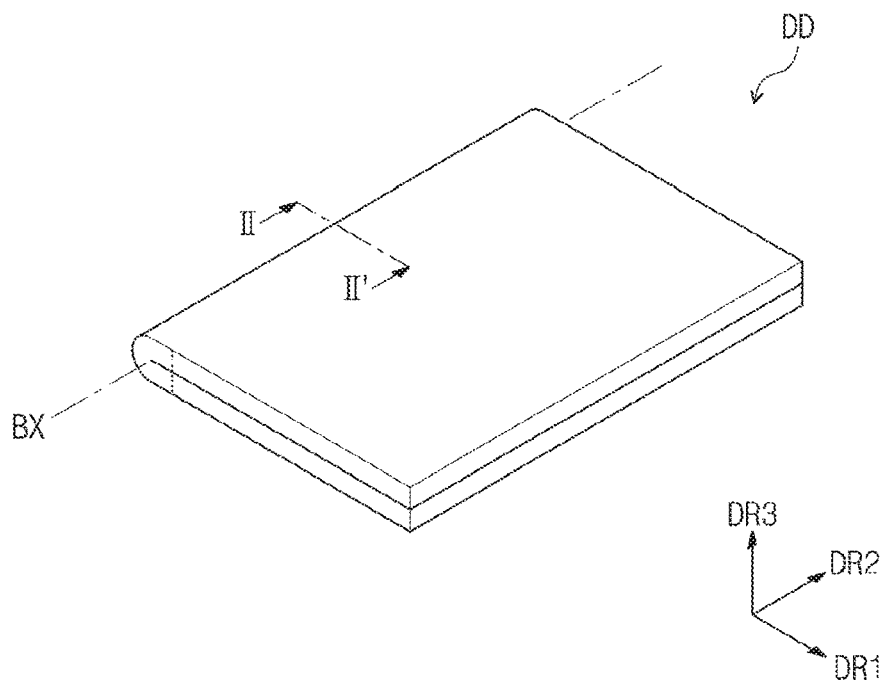
FIG. 2A is a perspective view illustrating the flexible display apparatus of FIG. 1A in a first bent state according to one or more exemplary embodiments.
Figure 2B:
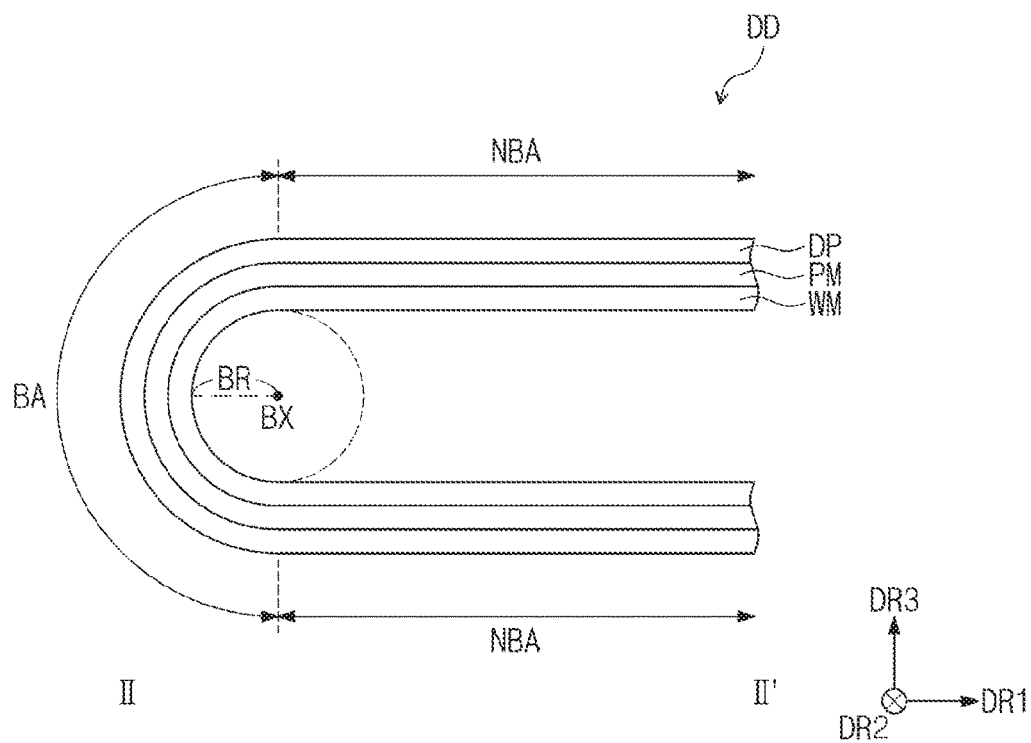
FIG. 2B is a cross-sectional view of the flexible display apparatus of FIG. 2A taken along sectional line II-II' according to one or more exemplary embodiments.
Figure 3A:
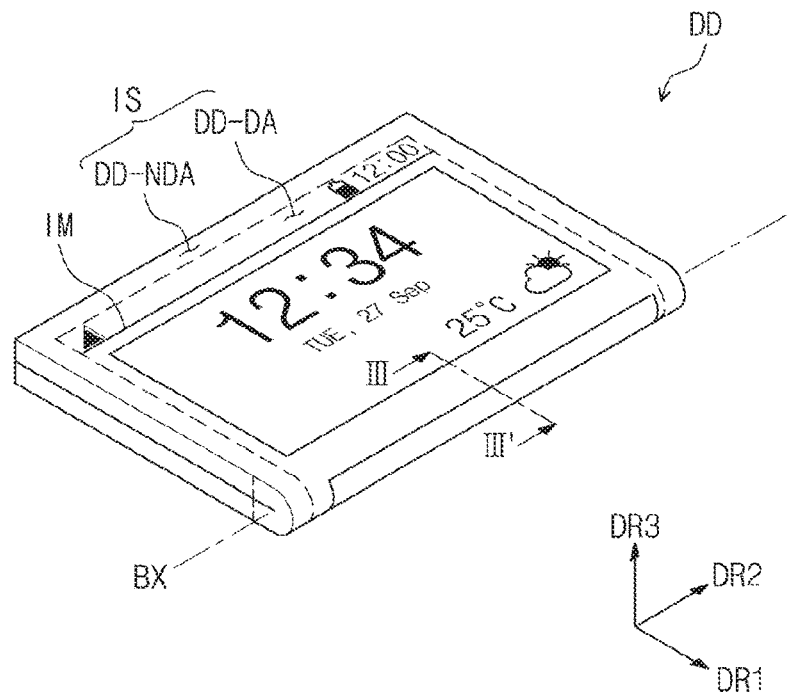
FIG. 3A is a perspective view illustrating the flexible display apparatus of FIG. 1A in a second bent state according to one or more exemplary embodiments.
Figure 3B:
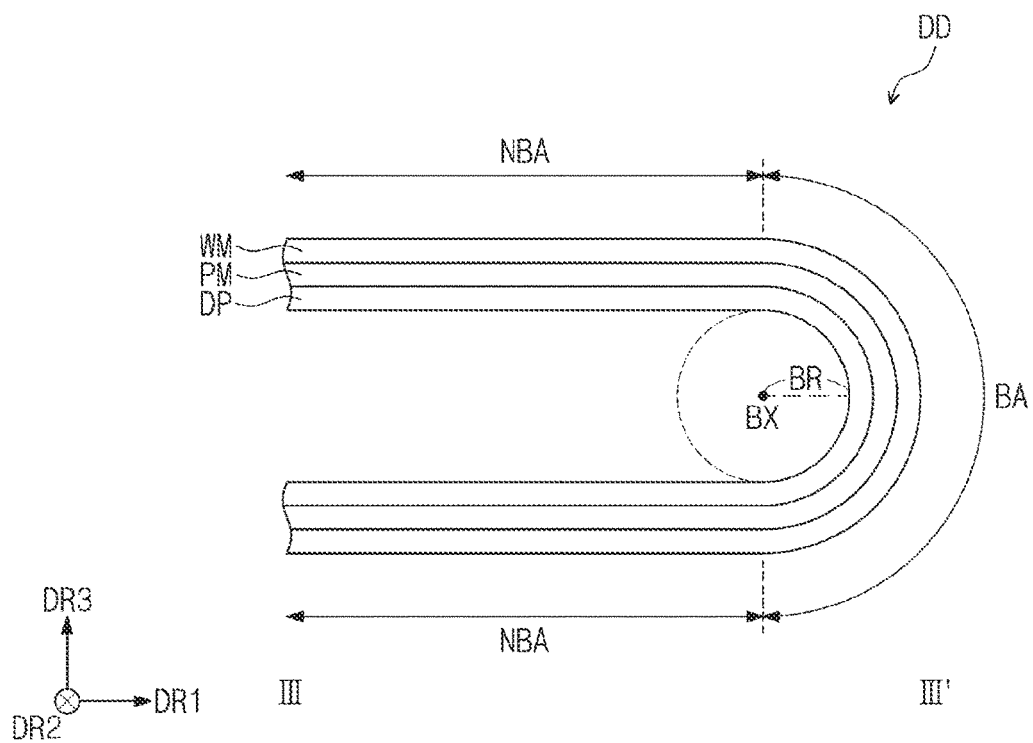
FIG. 3B is a cross-sectional view of the flexible display device of FIG. 3A taken along sectional line III-III' according to one or more exemplary embodiments.

FIG. 1A is a perspective view illustrating a flexible display apparatus in an unbent state according to one or more exemplary embodiments. FIG. 1B is a cross-sectional view of the flexible display device of FIG. 1A taken along sectional line I-I' according to one or more exemplary embodiments. FIG. 2A is a perspective view illustrating the flexible display apparatus of FIG. 1A in a first bent state according to one or more exemplary embodiments. FIG. 2B is a cross-sectional view of the flexible display apparatus of FIG. 2A taken along sectional line II-II' according to one or more exemplary embodiments. FIG. 3A is a perspective view illustrating the flexible display apparatus of FIG. 1A in a second bent state according to one or more exemplary embodiments. FIG. 3B is a cross-sectional view of the flexible display device of FIG. 3A taken along sectional line III-III' according to one or more exemplary embodiments.

FIGS. 1A, 1B, 2A, 2B, 3A, and 3B illustrate a foldable display apparatus as an example of a flexible display apparatus DD; however, exemplary embodiments are not limited thereto or thereby. For instance, the flexible display apparatus DD may include a display apparatus with a portion that is bent by a tensile force, a compressive force, a torsional force, and/or the like.

Referring to FIG. 1A, a display surface IS of the flexible display apparatus DD on which an image IM is displayed is parallel to a plane defined by a first direction DR1 and a second direction DR2. A direction normal to the display surface IS that defines a thickness direction of the flexible display apparatus DD is indicated by a third direction DR3. The front (or the upper surface) and the rear (or the lower surface) of each member are distinguished by the third direction DR3. It is noted, however, that the directions indicated by the first, second, and third directions DR1, DR2, and DR3 are relative concepts, and may be converted to other directions. Hereinafter, first to third directions will be indicated by and referred to as the first to third directions DR1, DR2, and DR3 respectively.

The flexible display apparatus DD may include a plurality of areas defined according to a form of operation of the flexible display apparatus DD. The flexible display apparatus DD may include a bending area BA, which may be bent with respect to a bending axis BX (see, e.g., FIG. 2A), and a non-bending area NBA, which may not be bent. The flexible display apparatus DD may include at least one bending area BA and at least one non-bending area NBA. As seen in FIG. 1A, the flexible display apparatus DD includes one bending area BA and two non-bending areas NBA, but exemplary embodiments are not limited thereto or thereby. For example, the flexible display apparatus DD may include a plurality of bending areas BA. It is also contemplated that the flexible display apparatus DD may include more one or more (e.g., more than two) non-bending areas NBA. The bending area BA and the non-bending area NBA may be disposed to be coupled together in the flexible display apparatus DD. For example, non-bending areas NBA may be disposed on opposing sides of the bending area BA.

The display surface IS of the flexible display apparatus DD may include a plurality of areas. The flexible display apparatus DD may include a display area DD-DA in which the image IM is displayed, and a non-display area DD-NDA adjacent to the display area DD-DA. The non-display area DD-NDA is an area in which the image IM is not displayed. In FIG. 1A, application icons and a clock window are illustrated as an example of the image IM. The display area DD-DA may be a quadrangular shape. The non-display area DD-NDA may be disposed to enclose the display area DD-DA. It is noted, however, that exemplary embodiments are not limited thereto or thereby, and the shape of the display area DD-DA and the shape of the non-display area DD-NDA may be relationally designed in any suitable manner.

Referring to FIG. 1B, the flexible display apparatus DD may include a display panel DP, and a polarizing member (or structure) PM disposed on the display panel DP. Additionally, the flexible display apparatus DD may further include a window member (or structure) WM disposed on the polarizing member PM, however, the window member WM may be omitted.

The display panel DP may generate an image, and provide the generated image to the front surface. The display panel DP may provide the generated image to a side in the third direction DR3. In one or more exemplary embodiments, the display panel DP may be an organic light-emitting display panel, however, exemplary embodiments are not limited thereto or thereby. For instance, the display panel DP may be a liquid crystal display panel, a plasma display panel, an electrophoretic display panel, a microelectromechanical system (MEMS) display panel, an electrowetting display panel, and/or the like.

The display panel DP may be a flexible display panel. The display panel DP may include a flexible substrate. For the purposes of this disclosure, the term "flexible" refers to configurations that can be intentionally bent, and, thereby, has bending properties. In this manner, the term "flexible" is not limited to a structure that may be bent and then fully folded, but may include a structure that is bent to the level of several nanometers (nm).

Referring to FIG. 1B, the display panel DP may include a display panel bending part DP-BA corresponding to the bending area BA of the flexible display apparatus DD, and a display panel non-bending part DP-NBA1 and DP-NBA2 corresponding to the non-bending area NBA of the flexible display apparatus DD. The display panel bending part DP-BA, and the display panel non-bending part DP-NBA1 and DP-NBA2 may be coupled together. In one or more exemplary embodiments, the display panel non-bending part DP-NBA1 and DP-NBA2 may be provided in plurality. For example, the display panel non-bending part DP-NBA1 and DP-NBA2 may include a first display panel non-bending part DP-NBA1 coupled to one end of the display panel bending part DP-BA, and a second display panel non-bending part DP-NBA2 coupled to the other end of the display panel bending part DP-BA.

As seen in FIG. 1B, the display panel non-bending parts DP-NBA1 and DP-NBA2 may be disposed respectively on both sides of the display panel bending part DP-BA with respect to the display panel bending part DP-BA. The display panel non-bending parts DP-NBA1 and DP-NBA2 may be disposed symmetrically with respect to the display panel bending to part DP-BA. However, exemplary embodiments are not limited thereto or thereby. For instance, the display panel non-bending parts DP-NBA1 and DP-NBA2 may be disposed only on one side of the display panel bending part DP-BA. As another example, the display panel bending part DP-BA may be disposed between the display panel non-bending parts DP-NBA1 and DP-NBA2, but the display panel bending part DP-BA may also be disposed to be lopsided toward one of the display panel non-bending parts DP-NBA1 and DP-NBA2. That is, the display panel bending part DP-BA may be off center or otherwise skewed to one side of the display panel DP. Also, the areas of the first display panel non-bending part DP-NBA1 and the second display panel non-bending part DP-NBA2 may be different from each other.

The polarizing member PM may be disposed on the display panel DP in the flexible display apparatus DD. The polarizing member PM may include optical members, such as a linear polarizer, a phase retardation layer, and an optical compensation layer. In one or more exemplary embodiments, the polarizing member PM may be disposed on an upper surface of the display panel DP to be capable of reducing reflectivity of external light provided from the outside, e.g., an ambient environment. The polarizing member PM may be a flexible polarizing member. The polarizing member PM will be described in more detail later.

The window member WM may be disposed on the polarizing member PM. The window member WM may protect the display panel DP, the polarizing member PM, and/or the like. The window member WM may be a flexible window. The window member WM may be composed of glass material or flexible plastic material. However, exemplary embodiments are not limited thereto or thereby. For instance, any form of a general window member may be used in association with exemplary embodiments. The window member WM may have a multilayer structure. The window member WM may have a multilayer structure selected from a glass substrate, a plastic film, and a plastic substrate. The window member WM may further include a bezel pattern. The window member WM may further include a surface protective layer (not illustrated). For example, a functional protective layer, such as a hard coating layer, and an anti-fingerprint layer may further be included on the window member WM.

The flexible display apparatus DD may be bent with respect to the bending axis BX in a first direction according to a first mode (see, e.g., FIG. 2A), bent with respect to the bending axis BX in a second direction according to a second mode (see, e.g., FIG. 3A), and may be unfolded in a third mode (see, e.g., FIG. 1A). The polarizing member PM may be disposed, in the first mode, closer to the bending axis BX than the display panel DP. In the second mode, the polarizing member PM may be disposed further away from the bending axis BX than the display panel DP.

It is noted that FIGS. 2A and 2B illustrate a state in which the flexible display apparatus DD is "in-folded" such that the display surface IS (see, e.g., FIG. 1A) of the flexible display apparatus DD is positioned inside, e.g., closer to the bending axis BX than a surface opposing the display surface IS. That is, FIGS. 2A and 2B illustrate a state in which the flexible display apparatus is bent in the first mode. It is also noted that FIGS. 3A and 3B illustrate a state in which the display apparatus is "out-folded" such that the display surface IS (see, e.g., FIG. 1A) of the flexible display apparatus DD is exposed outside, e.g., further from the bending axis BX than the surface opposing the display surface IS. That is, FIGS. 3A and 3B illustrate a state in which the flexible display apparatus DD is bent in the second mode.

In FIG. 2B or FIG. 3B, a radius of curvature BR of the bending area BA of the flexible display apparatus DD may be greater than 0 mm and less than or equal to 5 mm. For example, the radius of curvature BR may be a radius of curvature formed by an inside surface of the bending area BA in a bent or folded state. For instance, the radius of curvature BR in the flexible display apparatus DD may be from 1 mm to 5 mm inclusive.

According to one or more exemplary embodiments, the flexible display apparatus DD may be configured to repeat operation modes illustrated only in FIG. 1A and FIG. 2A, or only in FIG. 1A and FIG. 3A. However, exemplary embodiments are not limited thereto or thereby. For instance, the bending area BA may be defined to correspond to a mode in which a user manipulates the flexible display apparatus DD. Additionally, the area of the bending area BA may not be fixed, but may be determined depending on the radius of curvature BR.

Referring to FIGS. 1A, 1B, 2A, 2B, 3A, and 3B, the flexible display apparatus DD may include the display panel DP having the bending area BA such that the flexible display apparatus DD is transformable into a bent shape or has a bent shape with respect to the bending axis BX extending in one direction, and the polarizing member PM disposed on the display panel DP. In FIGS. 1A, 1B, 2A, 2B, 3A, and 3B, the one direction in which the bending axis BX extends is illustrated to be the second direction DR2, but exemplary embodiments are not limited thereto or thereby. For example, a direction in which the bending axis BX extends may be different according to a shape into which the flexible display apparatus DD is transformed.

Figure 4A:
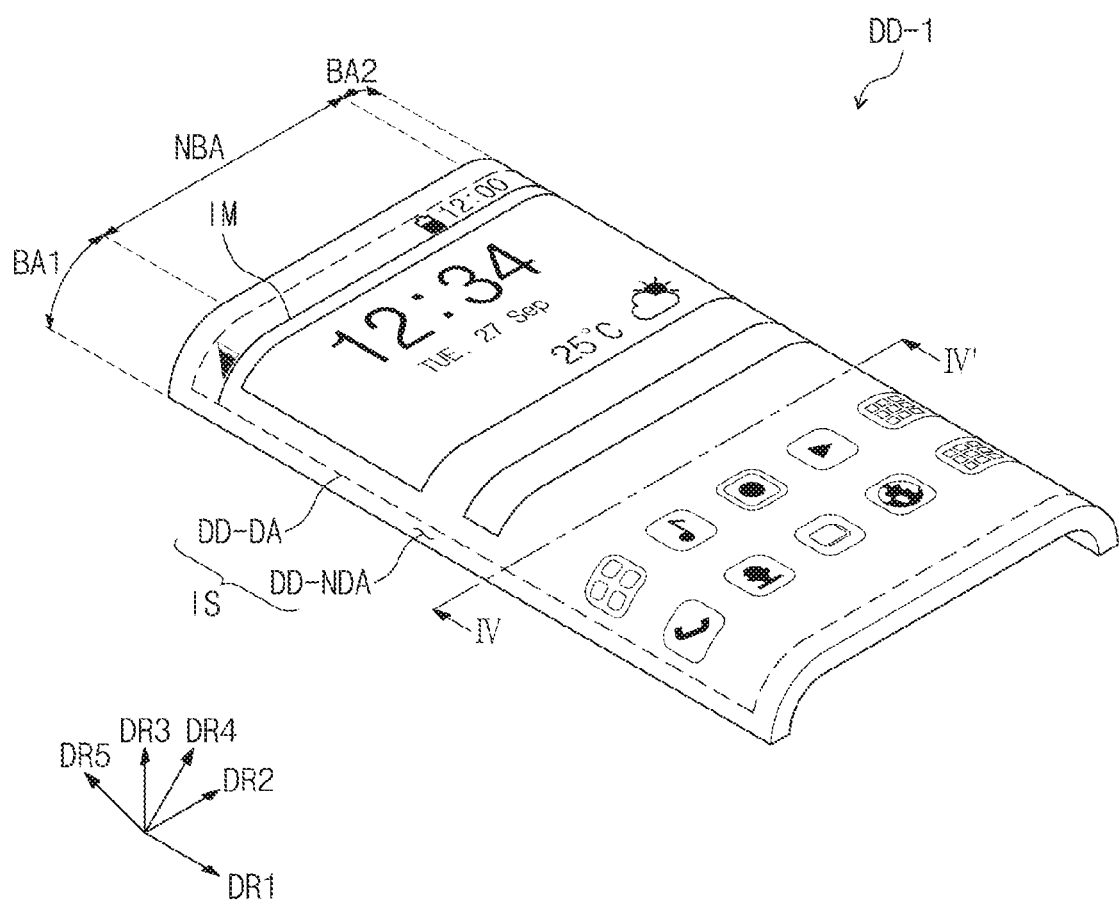
FIG. 4A is a perspective view illustrating a flexible display apparatus according to one or more exemplary embodiments.
Figure 4B:
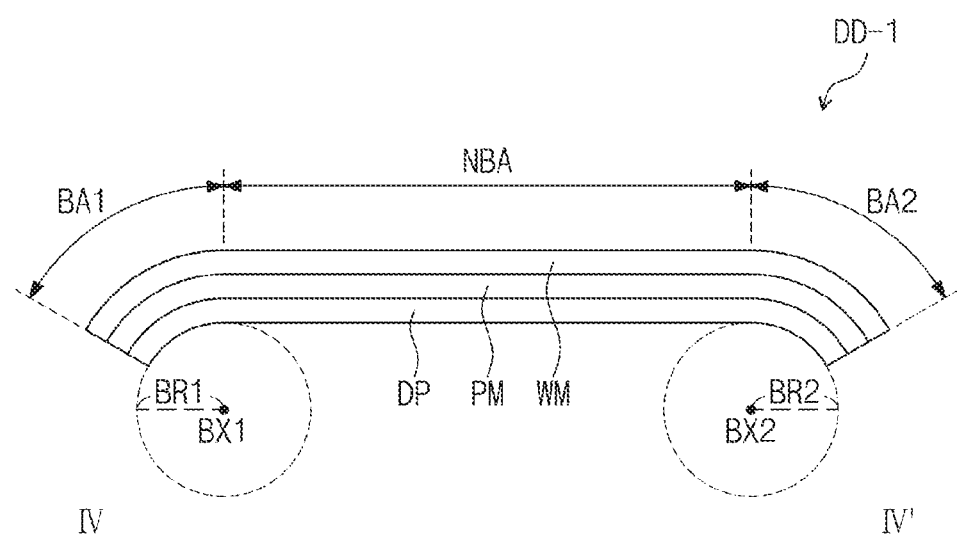
FIG. 4B is a cross-sectional view of the flexible display apparatus of FIG. 4A taken along sectional line IV-IV' according to one or more exemplary embodiments.
Figure 4B:
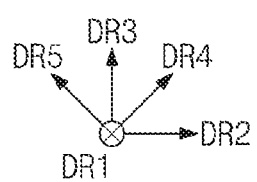

FIG. 4A is a perspective view illustrating a flexible display apparatus according to one or more exemplary embodiments. FIG. 4B is a cross-sectional view of the flexible display apparatus of FIG. 4A taken along sectional line IV-IV' according to one or more exemplary embodiments. The flexible display apparatus of FIGS. 4A and 4B is similar to the flexible display apparatus of FIGS. 1A, 1B, 2A, 2B, 3A, and 3B. As such, duplicative descriptions will be primarily omitted to avoid obscuring exemplary embodiments.

As seen in FIGS. 4A and 4B, the flexible display apparatus DD-1 may include bending areas BA1 and BA2, and the non-bending area NBA. Each of the bending areas BA1 and BA2 may be bent from a corresponding side of the non-bending area NBA.

Referring to FIGS. 4A and 4B, the flexible display apparatus DD-1 may include the non-bending area NBA in which the image IM is displayed on a first (e.g., front) surface of the flexible display apparatus DD-1, and a first bending area BA1 and a second bending area BA2 in which the image IM is displayed on second (e.g., side) surfaces of the flexible display apparatus DD-1. The first bending area BA1 and the second bending area BA2 may be bent respectively from opposing sides of the non-bending area NBA. The first bending area BA1 and the second bending area BA2 may be areas bent respectively with respect to a first bending axis BX1 and a second bending axis BX2.

The first bending area BA1 bent with respect to the first bending axis BX1 may have a first radius of curvature BR1, and the second bending area BA2 bent with respect to the second bending axis BX2 may have a second radius of curvature BR2. The first radius of curvature BR1 of the first bending area BA1 and the second radius of curvature BR2 of the second bending area BA2 may each be greater than 0 mm and less than or equal to 5 mm, such as 1 mm to 5 mm, inclusive. The first radius of curvature BR1 and the second radius of curvature BR2 may be equal to one another. Alternatively, the first radius of curvature BR1 and the second radius of curvature BR2 may be different from each other.

Referring to FIGS. 4A and 4B, the non-bending area NBA may provide the image IM in the third direction DR3 in which the front surface of the flexible display apparatus DD-1 faces. The first bending area BA1 may provide the image IM generally in a fifth direction DR5, whereas the second bending area BA2 may provide the image IM generally in a fourth direction DR4. The fourth direction DR4 and the fifth direction DR5 may be directions which cross the first to third directions DR1, DR2 and DR3. It is contemplated, however, that the directions indicated by the first to fifth directions DR1 to DR5 are relative, and, as such, are not limited to or by the illustrated directional relationships.

The flexible display apparatus DD-1 may be a bendable display apparatus including the non-bending area NBA, and the bending areas BA1 and BA2 disposed respectively on opposing sides of the non-bending area NBA. Alternatively, although not illustrated, the flexible display apparatus DD-1 may be a bendable display apparatus including one non-bending area and one bending area. In this case, the one bending area may be provided to be bent only on one side of the one non-bending area.

Figure 5:
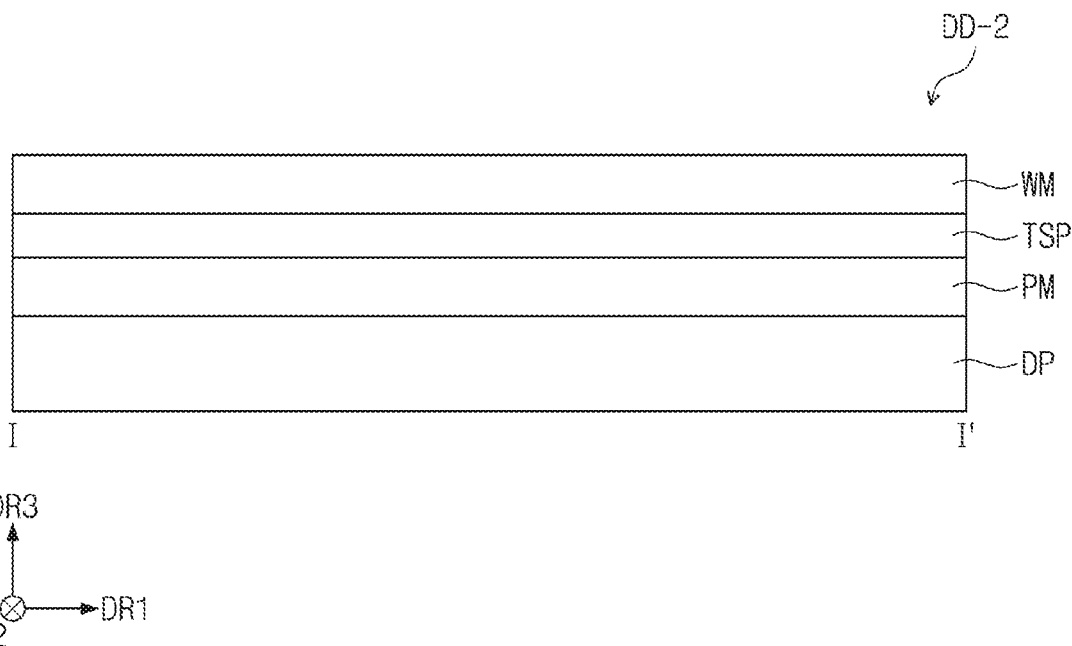
FIG. 5 is a cross-sectional view illustrating a flexible display apparatus according to one or more exemplary embodiments.

FIG. 5 is a cross-sectional view illustrating a flexible display apparatus according to one or more exemplary embodiments. It is noted that FIG. 5 illustrates a cross-section of display apparatus DD-2 corresponding to sectional line I-I' of FIG. 1A. The flexible display apparatus DD-2 of FIG. 5 is similar to the flexible display apparatus DD of FIGS. 1A and 1B, however, the flexible display apparatus DD-2 may include the display panel DP, the polarizing member PM, a touch sensing unit (or structure) TSP, and the window member WM. The touch sensing unit TSP may be disposed on an upper surface or a lower surface of the polarizing member PM. In other words, the touch sensing unit TSP may be disposed between the window member WM and the polarizing member PM or disposed between the polarizing member PM and the display panel DP.

As seen in FIG. 5, the flexible display apparatus DD-2 includes the touch sensing unit TSP disposed on the polarizing member PM. In other words, the flexible display apparatus DD-2 includes the display panel DP, the polarizing member PM disposed on the display panel DP, the touch sensing unit TSP disposed on the polarizing member PM, and the window member WM disposed on the touch sensing unit TSP.

Although not illustrated, the touch sensing unit TSP includes touch sensors and touch signal lines. The touch sensors and the touch signal lines may have a single layer or multilayer structure. The touch sensors and the touch signal lines may include any suitable material, such as, for instance, indium tin oxide (ITO), indium zinc oxide (IZO), zinc oxide (ZnO), indium tin zinc oxide (ITZO), PEDOT, metal nanowire, or graphene. The touch sensors and the touch signal lines may include a metal layer of, for example, molybdenum, silver, titanium, copper, aluminum, or an alloy thereof. The touch sensors and the touch signal lines may have the same layer structure, or a different layer structure from one another.

Alternatively, unlike as shown in FIG. 5, the touch sensing unit TSP may be disposed between the display panel DP and the polarizing member PM in the flexible display apparatus DD-2. The touch sensing unit TSP may be disposed directly on the display panel DP.

For the purposes of this disclosure, the phrase "being disposed directly on" excludes being attached using a separate adhesive member, and means being formed by a continuous process. For example, in the case that the display panel DP is an organic light-emitting display panel, the touch sensing unit TSP may be disposed directly on the organic light-emitting display panel. That is, the touch sensing unit TSP may be disposed directly on an encapsulation layer of the organic light-emitting display panel.

Additionally, the window member WM of the flexible display apparatus DD-2 may be omitted. Although not illustrated, an adhesive member may be disposed between the display panel DP and the polarizing member PM, between the polarizing member PM and the touch sensing unit TSP, or between the touch sensing unit TSP and the window member WM. In this case, the adhesive member may be an optically clear adhesive (OCA) film, or an optically clear adhesive resin (OCR) layer.

The polarizing member PM of the flexible display apparatuses DD, DD-1, and DD-2 will now be described in more detail below with reference to FIGS. 6, 7A to 7C, and 8. It is noted, however, that the various polarizing members of FIGS. 6, 7A to 7C, and 8 will be distinguished from one another through different call reference numbers, but any one of the polarizing members of FIGS. 6, 4 7A to 7C, and 8 may be utilized as the polarizing member PM of FIGS. 1A, 1B, 2A, 2B, 3A, 3B, 4A, 4B, and 5.

Figure 6:
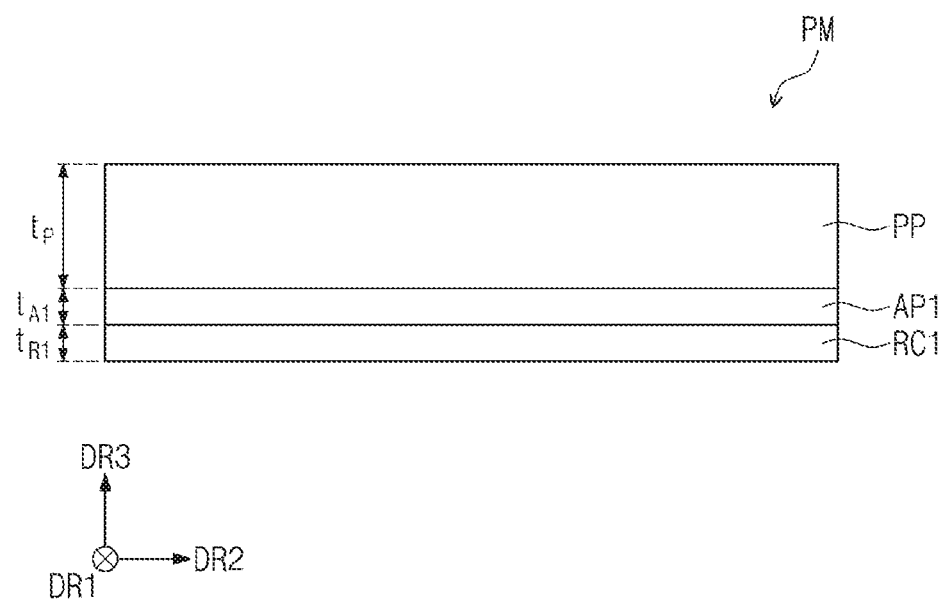
FIG. 6 is a cross-sectional view illustrating a polarizing member of a flexible display apparatus according to one or more exemplary embodiments.

FIG. 6 is a cross-sectional view illustrating a polarizing member of a flexible display apparatus according to one or more exemplary embodiments. Referring to FIG. 6, the polarizing member PM may include a linear polarizer PP, a λ/4 phase retardation layer RC1, and a first adhesive member (or layer) AP1. The λ/4 phase retardation layer RC1 may be disposed most adjacent to the display panel DP (see, e.g., FIG. 1B) than other layers of the polarizing member PM. In one or more exemplary embodiments, the λ/4 phase retardation layer RC1, the first adhesive member AP1, and the linear polarizer PP may be disposed to be sequentially laminated (or otherwise stacked) in the third direction DR3.

The linear polarizer PP may linearly polarize light propagating in a direction. The linear polarizer PP may be a film-type polarizer including a stretched polymer film. For example, the stretched polymer film may be a stretched polyvinyl alcohol-based film, however, exemplary embodiments are not limited thereto or thereby. In one or more exemplary embodiments, the linear polarizer PP may be manufactured by adsorbing dichroic dye on the stretched polymer film. For example, the linear polarizer PP may be manufactured by adsorbing iodine on a stretched polyvinyl alcohol film. In this case, a direction in which the polymer film is stretched may be an absorption axis of the linear polarizer PP, and a direction perpendicular to the direction in which the polymer film is stretched may be a transmission axis of the linear polarizer PP.

Although not illustrated, the linear polarizer PP may further include at least one protective layer. For example, a triacetyl cellulose (TAC) layer may further be included on at least one of an upper surface and a lower surface of the linear polarizer PP. Exemplary embodiments, however, are not limited thereto or thereby. For instance, the linear polarizer PP may further include, as the protective layer, a hard coating layer, an anti-reflective layer, an anti-glare layer, and/or the like.

The polarizing member PM may include the λ/4 phase retardation layer RC1 disposed on a lower surface of the linear polarizer PP. The λ/4 phase retardation layer RC1 may be an optical layer for retarding the phase of provided light by λ/4. For example, when the wavelength of light that has passed through the linear polarizer PP and is provided to the λ/4 phase retardation layer RC1 is 550 nm, the light having passed through the λ/4 phase retardation layer RC1 may have a phase retardation value of 137.5 nm.

Additionally, the λ/4 phase retardation layer RC1 may have optical anisotropy, and change a polarization state of light incident on the λ/4 phase retardation layer RC1. In other words, light that has passed through the linear polarizer PP and is provided to the λ/4 phase retardation layer RC1 may change from a linear polarization state to a circular polarization state. Alternatively, light provided to the λ/4 phase retardation layer RC1 with a circular polarization state may change to a linear polarization state.

In one or more exemplary embodiments, the λ/4 phase retardation layer RC1 may be an A-plate. That is, when a refractive index of the λ/4 phase retardation layer RC1 in the first direction DR1 is defined as a first refractive index n1, a refractive index in the second direction DR2 is defined as a second refractive index n2, and a refractive index in the third direction DR3 is defined as a third refractive index n3, the first to third refractive indices n1 to n3 may satisfy Equation 1, as shown below.

$$n1 \neq n2 \approx n3 \qquad \text{Equation 1}$$

The second and third refractive indices n2 and n3 may be substantially equal to one another. However, exemplary embodiments are not limited thereto or thereby. For instance, and the second and third refractive indices n2 and n3 may be different from each other.

A phase retardation layer, such as the λ/4 phase retardation layer RC1, may have an in-plane phase retardation value Re, and a phase retardation value Rth in a thickness direction. The in-plane phase retardation value Re, and the phase retardation value Rth in the thickness direction may be calculated (or otherwise determined) according to Equation 2. It is noted that d in Equation 2 represents the thickness of the phase retardation layer.

$$Re = (n1 - n2) * d$$
$$Rth = \left(\frac{(n1 + n2)}{2} - n3\right) * d$$

Equation 2

The phase retardation value Rth in the thickness direction may be compensated for by further including an optical compensation layer in the polarizing member PM. The optical compensation layer may be a C-plate. The optical compensation layer will be described in more detail later.

The λ/4 phase retardation layer RC1 may be a liquid crystal coating layer in the polarizing member PM. The λ/4 phase retardation layer RC1 may be a liquid crystal coating layer manufactured using a reactive liquid crystal monomer. The λ/4 phase retardation layer RC1 may be manufactured through a process of polymerizing after coating and aligning a reactive liquid crystal monomer. For example, the liquid crystal monomer used in the λ/4 phase retardation layer RC1 may have a rod-shaped nematic phase. That is, the λ/4 phase retardation layer RC1 may be a nematic liquid crystal coating layer.

The λ/4 phase retardation layer RC1 may be composed of a liquid crystal coating layer only without a base substrate that is typically utilized as a support. The total thickness of a flexible display apparatus (e.g., flexible display apparatus DD) may be reduced by using, in the polarizing member PM, the λ/4 phase retardation layer RC1 composed of the liquid crystal coating layer only without including the base substrate. In other words, the thickness of the polarizing member PM may be reduced by using the λ/4 phase retardation layer RC1 that is the liquid crystal coating layer, and, as such, the flexible display apparatus may be bent more easily.

A thickness $t_{R1}$ of the λ/4 phase retardation layer RC1 that is the liquid crystal coating layer may be from 0.5 μm to 5 μm inclusive. For instance, the thickness $t_{R1}$ of the λ/4 phase retardation layer RC1 may be from 0.5 μm to 2 μm inclusive. When the thickness $t_{R1}$ of the λ/4 phase retardation layer RC1 becomes smaller than 0.5 μm, the implementation of optical properties may not be uniform in the λ/4 phase retardation layer RC1, and when the thickness $t_{R1}$ of the λ/4 phase retardation layer RC1 becomes larger than 5 μm, a thickness reduction effect of the polarizing member PM may be insufficient. In other words, when the thickness $t_{R1}$ of the λ/4 phase retardation layer RC1 becomes larger than 5 μm, flexibility in a flexible display apparatus DD may not be satisfactory, and, in this manner, a crack may occur within the λ/4 phase retardation layer RC1 and display quality may be degraded.

The first adhesive member AP1 may be disposed between the λ/4 phase retardation layer RC1 and the linear polarizer PP. The first adhesive member AP1 may be an adhesive layer with a glass transition temperature Tg from 40° C. to 150° C. inclusive. Given that the first adhesive member AP1 has a glass transition temperature higher than room temperature, bonding strength between the λ/4 phase retardation layer RC1 and the linear polarizer PP may be increased. Additionally, by forming the first adhesive member AP1 with an adhesive layer having a relatively high glass transition temperature, deformation may be minimized when the first adhesive member AP1 is folded or bent under the condition of room temperature or relatively high temperature. Also, deformation of the λ/4 phase retardation layer RC1 adjacent to the first adhesive member AP1 may also be minimized or at least reduced.

The first adhesive member AP1 may be an adhesive layer cross-linked through an ultraviolet curing or heat curing process. The first adhesive member AP1 may be an adhesive layer including at least one among an acrylic resin, a silicone resin, a urethane resin, and an epoxy resin.

The first adhesive member AP1 may include an ultraviolet curable adhesive. The first adhesive member AP1 may be an adhesive layer formed by polymerizing and curing through at least one reaction of radical polymerization and cationic polymerization.

The adhesive layer constituting the first adhesive member AP1 may be formed with an adhesive composition including a cationic polymerizable compound. For example, the adhesive composition may include at least one among an epoxy compound, a vinyl ether compound, an oxetane compound, an oxolane compound, a cyclic acetal compound, a cyclic lactone compound, a thiirane compound, a thio vinyl ether compound, a spiroorthoester compound, an ethylene unsaturated compound, a cyclic ether compound, and a cyclic thioether compound. Alternatively (or additionally), the adhesive layer constituting the first adhesive member AP1 may be formed with an adhesive composition including a radical polymerizable compound having a radical polymerization reactor. For example, the radical polymerizable compound may be an acrylic compound, and specifically, a methacrylate compound.

The adhesive composition forming the first adhesive member AP1 may include photoinitiator, and/or the like. Additionally, the adhesive composition may further include an additive, such as a photosensitizer, a silane coupling agent, a plasticizer, and a defoaming agent in addition to the photoinitiator.

A thickness $t_{41}$ of the first adhesive member AP1 may be from 0.1 μm to 5 μm inclusive. For instance, the thickness $t_{41}$ of the first adhesive member AP1 may be from 0.5 μm to 3 μm inclusive. When the thickness $t_{41}$ of the first adhesive member AP1 is smaller than 0.1 μm, adhesive strength for bonding the linear polarizer PP and the λ/4 phase retardation layer RC1 together may not be obtained, and, as such, peeling of the first adhesive member AP1 may occur when the flexible display apparatus is bent. Additionally, when the thickness $t_{41}$ of the first adhesive member AP1 becomes larger than 5 μm, a thickness reduction effect of the polarizing member PM may be insufficient, and a crack may occur in the λ/4 phase retardation layer RC1 adjacent to the first adhesive member AP1 under a high temperature reliability condition. As such, display quality may be reduced.

The sum of the thickness $t_{41}$ of the first adhesive member AP1 and the thickness $t_{R1}$ of the λ/4 phase retardation layer RC1 may be less than or equal to a thickness $t_P$ of the linear polarizer PP. In other words, in one or more exemplary embodiments, the total thickness of the polarizing member PM may be reduced by forming the λ/4 phase retardation layer RC1 with a liquid crystal coating layer, and forming the first adhesive member AP1 with an adhesive composition.

Alternatively, the first adhesive member AP1 may be formed with an adhesive layer with a glass transition temperature from 40° C. to 150° C. inclusive so as to maintain adhesive strength between the linear polarizer PP and the λ/4 phase retardation layer RC1. Additionally, when the flexible display apparatus (e.g., flexible display apparatus DD) is folded or bent, deformation of the first adhesive member AP1 may not occur, and, as such, deformation of the λ/4 phase retardation layer RC1 adjacent thereto may be prevented (or at least reduced), thereby alleviating display quality degradation due to the deformation of the λ/4 phase retardation layer RC1 of the flexible display apparatus.

It is also contemplated that the polarizing member PM, in one or more exemplary embodiments, may include the linear polarizer PP and the λ/4 phase retardation layer RC1, and the polarizing member PM may be disposed on the display panel DP (see, e.g., FIG. 1B), thereby reducing external light reflectivity of the flexible display apparatus, such as flexible display apparatus DD (see, e.g., FIG. 1B).

FIGS. 7A, 7B, 7C, and 8 are cross-sectional views illustrating polarizing members of flexible display apparatuses according to various exemplary embodiments. In one or more exemplary embodiments, the polarizing member PM may further include at least one optical layer in addition to the λ/4 phase retardation layer RC1 and the linear polarizer PP. Hereinafter, when a polarizing member PM of FIGS. 7A to 7C and 8 are described, duplicative descriptions will be primarily omitted to avoid obscuring exemplary embodiments, and differences will be mainly described.

Figure 7A:
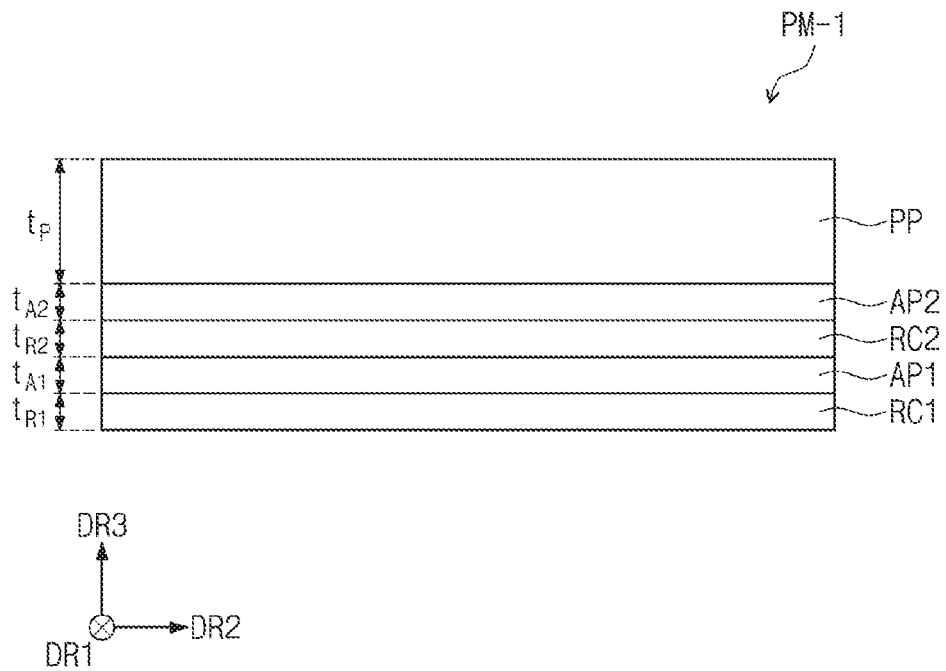
FIGS. 7A, 7B, 7C, and 8 are cross-sectional views illustrating polarizing members of flexible display apparatuses according to various exemplary embodiments.

Referring to FIG. 7A, the polarizing member PM-1 may further include a λ/2 phase retardation layer RC2 in addition to the λ/4 phase retardation layer RC1 and the linear polarizer PP. The λ/2 phase retardation layer RC2 may be disposed between the λ/4 phase retardation layer RC1 and the linear polarizer PP. That is, the λ/2 phase retardation layer RC2 may be disposed between the first adhesive member AP1 and the linear polarizer PP. In addition, a second adhesive member AP2 may be further included between the λ/2 phase retardation layer RC2 and the linear polarizer PP.

The λ/2 phase retardation layer RC2 may be an optical layer for retarding the phase of provided light by λ/2. For example, when the wavelength of light that has passed through the linear polarizer PP, and is provided to the λ/2 phase retardation layer RC2 is 550 nm, the light having passed through the λ/2 phase retardation layer RC2 may have a phase retardation value of 275 nm. Additionally, the λ/2 phase retardation layer RC2 may change a polarization state of light incident on the λ/2 phase retardation layer RC2. A polarization direction of linearly polarized light may change which has been incident on the λ/2 phase retardation layer RC2 from the linear polarizer PP.

One among a phase retardation value of the λ/4 phase retardation layer RC1 in a thickness direction, and a phase retardation value of the λ/2 phase retardation layer RC2 in the thickness direction may have a positive value, and the other may have a negative value. For example, the λ/4 phase retardation layer RC1 may be a positive A-plate, and the λ/2 phase retardation layer RC2 may be a negative A-plate.

In Equation 1 provided above, a case that n1>n2 is referred to as the positive A-plate, and a case that n1<n2 is referred to as the negative A-plate. Accordingly, in the case of the positive A-plate, a phase retardation value in the thickness direction may have a positive value, and in the case of the negative A-plate, a phase retardation value in the thickness direction may have a negative value. Accordingly, when the polarizing member PM includes both the λ/4 phase retardation layer RC1 and the λ/2 phase retardation layer RC2 that have been laminated, a phase difference in the thickness direction may be offset and decreased. Thus, according to one or more exemplary embodiments, a change in the phase difference according to a viewing angle may be decreased because phase retardation values of the λ/4 phase retardation layer RC1 and the λ/2 phase retardation layer RC2 in the thickness direction have polarities different from each other. As a result, color shift may be reduced, resulting in display quality improvement.

The λ/2 phase retardation layer RC2 may be a liquid crystal coating layer. The λ/2 phase retardation layer RC2 may be a liquid crystal coating layer manufactured using a reactive liquid crystal monomer. The λ/2 phase retardation layer RC2 may be manufactured through a process of polymerizing after coating and aligning the reactive liquid crystal monomer. For example, the liquid crystal monomer used in the λ/2 phase retardation layer RC2 may have a disc-shaped discotic phase. That is, the λ/2 phase retardation layer RC2 may be a discotic liquid crystal coating layer.

The λ/2 phase retardation layer RC2 may be composed of a liquid crystal coating layer only without a base substrate that is typically utilized as a support. The total thickness of a flexible display apparatus (e.g., flexible display apparatus DD) may be reduced by including, in the polarizing member PM, the λ/2 phase retardation layer RC2 composed of the liquid crystal coating layer only without including a base substrate. In other words, the thickness of the polarizing member PM may be reduced by using the λ/2 phase retardation layer RC2 that is the liquid crystal coating layer, and, as such, the flexible display apparatus may be bent more easily.

A thickness $t_{R2}$ of the λ/2 phase retardation layer RC2 that is the liquid crystal coating layer may be from 0.5 μm to 5 μm inclusive. For example, the thickness $t_{R2}$ of the λ/2 phase retardation layer RC2 may be from 0.5 μm to 2 μm inclusive. Additionally, the thickness $t_{R2}$ of the λ/2 phase retardation layer RC2 may be equal to or different from the thickness $t_{R1}$ of the λ/4 phase retardation layer RC1. The thickness $t_{R2}$ of the λ/2 phase retardation layer RC2 may be greater than the thickness $t_{R1}$ of the λ/4 phase retardation layer RC1.

When the thickness $t_{R2}$ of the λ/2 phase retardation layer RC2 becomes smaller than 0.5 μm, the implementation of optical properties may not be uniform in the λ/2 phase retardation layer RC2, and when the thickness $t_{R2}$ of the λ/2 phase retardation layer RC2 becomes larger than 5 μm, a thickness reduction effect of the polarizing member PM may be insufficient. In other words, when the thickness $t_{R2}$ of the λ/2 phase retardation layer RC2 becomes larger than 5 μm, a crease or a crack may occur within the λ/2 phase retardation layer RC2 under a folding or bending condition. This may degrade display quality.

The second adhesive member AP2 may be disposed between the λ/2 phase retardation layer RC2 and the linear polarizer PP so as to bond the λ/2 phase retardation layer RC2 and the linear polarizer PP together. The second adhesive member AP2 may be a pressure sensitive adhesive layer with a glass transition temperature from −35° C. to 0° C. inclusive, or an adhesive layer with a glass transition temperature from 40° C. to 150° C. inclusive.

In one or more exemplary embodiments, because the pressure sensitive adhesive layer has a glass transition temperature lower than room temperature, the pressure sensitive adhesive layer may correspond to an adhesive member having tackiness at room temperature. In this manner, because the adhesive layer has a glass transition temperature higher than room temperature, the adhesive layer may correspond to an adhesive member without tackiness at room temperature. The pressure sensitive adhesive layer may be an adhesive member having a relatively low modulus value compared with the adhesive layer.

The pressure sensitive adhesive layer may be formed of a pressure sensitive adhesive composition including at least one among an acrylic pressure sensitive adhesive, a silicone pressure sensitive adhesive, an epoxy pressure sensitive adhesive, and a rubber pressure sensitive adhesive. The pressure sensitive adhesive composition may further include an additive, such as a silane coupling agent, a tackifying resin, a hardener, an ultraviolet stabilizer, an antioxidant, and a filler.

The adhesive layer may be formed of an adhesive composition including at least one among an acrylic resin, a silicone resin, a urethane resin, and an epoxy resin. For example, the adhesive layer and the pressure sensitive adhesive layer may all be formed of an acrylic compound, but may be adhesive members having degrees of polymerization different from each other, or degrees of cross-linking different from each other.

For example, when the second adhesive member AP2 is the pressure sensitive adhesive layer, the second adhesive member AP2 may have a softer property at room temperature than the first adhesive member AP1. When the second adhesive member AP2 is the pressure sensitive adhesive layer, the second adhesive member AP2 may have a smaller modulus than the first adhesive member AP1. A glass transition temperature of the second adhesive member AP2 may be lower than that of the first adhesive member AP1.

When the second adhesive member AP2 is the adhesive layer, the second adhesive member AP2 may have a modulus value equal to that of the first adhesive member AP1. Alternatively, the second adhesive member AP2 may be an adhesive layer having a modulus value different from that of the first adhesive member AP1. Both the second adhesive member AP2 and the first adhesive member AP1 may have glass transition temperatures higher than room temperature, and may correspond to a non-sticky adhesive members at room temperature.

A thickness $t_{A2}$ of the second adhesive member AP2 may be from 0.1 μm to 5 μm inclusive. For instance, the thickness $t_{A2}$ of the second adhesive member AP2 may be from 0.5 μm to 3 μm inclusive. When the thickness $t_{A2}$ of the second adhesive member AP2 is smaller than 0.1 μm, adhesive strength for bonding the linear polarizer PP and the λ/2 phase retardation layer RC2 together may not be obtained, and, as such, peeling of the second adhesive member AP2 may occur when the flexible display apparatus, e.g., flexible display apparatus DD, is bent. Additionally, when the thickness $t_{A2}$ of the second adhesive member AP2 becomes larger than 5 μm, a thickness reduction effect of the polarizing member PM may be insufficient. Additionally, when the thickness $t_{A2}$ of the second adhesive member AP2 becomes larger than 5 μm, a crease or a crack may occur in the second adhesive member AP2 under a bending or folding condition.

The thickness $t_P$ of the linear polarizer PP may be greater than or equal to the sum of the thickness $t_{R2}$ of the λ/2 phase retardation layer RC2, the thickness $t_{A2}$ of the second adhesive member AP2, the thickness $t_{R1}$ of the λ/4 phase retardation layer RC1, and the thickness $t_{A1}$ of the first adhesive member AP1.

Figure 7B:
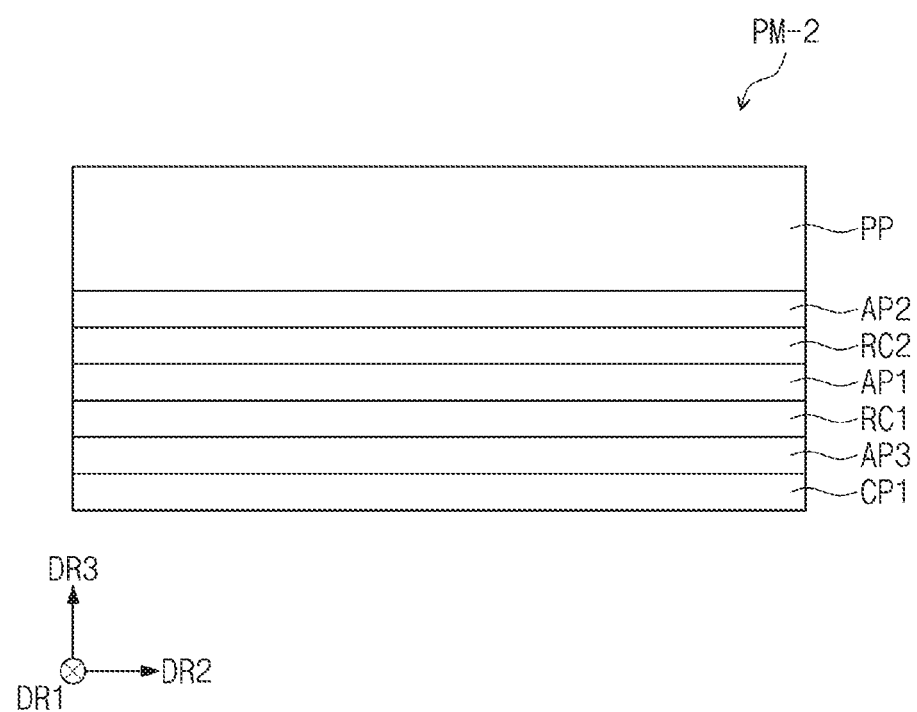

Referring to FIG. 7B, the polarizing member PM-2 may further include a first optical compensation layer CP1 in addition to the λ/4 phase retardation layer RC1, the linear polarizer PP, and the λ/2 phase retardation layer RC2. The first optical compensation layer CP1 may be disposed on a lower surface of the λ/4 phase retardation layer RC1. That is, the first optical compensation layer CP1 may be disposed most adjacent to the display panel DP (see, e.g., FIG. 1B) among the various layers of the polarizing member PM-2. In one or more exemplary embodiments, the polarizing member PM may include the first optical compensation layer CP1, the λ/4 phase retardation layer RC1, the λ/2 phase retardation layer RC2, and the linear polarizer PP disposed to be laminated (or stacked) in the third direction DR3.

The first optical compensation layer CP1 may be an optical functional layer for compensating for the phase retardation value Rth in the thickness direction of the λ/4 phase retardation layer RC1. The first optical compensation layer CP1 may be a C-plate. For instance, when a refractive index of the first optical compensation layer CP1 in the first direction DR1 is defined as a first refractive index n1, a refractive index in the second direction DR2 is defined as a second refractive index n2, and a refractive index in the third direction DR3 is defined as a third refractive index n3, the first to third refractive indices n1 to n3 may satisfy Equation 3, as shown below.

$$n1 \approx n2 \neq n3 \quad \text{Equation 3}$$

In the first optical compensation layer CP1, the first and second refractive indices n1 and n2 may be substantially equal. However, exemplary embodiments are not limited thereto or thereby. For instance, the first and second refractive indices n1 and n2 may be different from each other.

The first optical compensation layer CP1 may be a negative C-plate or a positive C-plate. For example, when the λ/4 phase retardation layer RC1 has a phase retardation value Rth in the thickness direction with a negative value, the first optical compensation layer CP1 may be a positive C-plate, and when the λ/4 phase retardation layer RC1 has a phase retardation value Rth in the thickness direction with a positive value, the first optical compensation layer CP1 may be a negative C-plate. The first optical compensation layer CP1 may be a form of a solidified layer or a cured layer of a liquid crystal composition including a liquid crystal compound. Alternatively, the first optical compensation layer CP1 may be provided in a film type.

A third adhesive member AP3 may be disposed between the first optical compensation layer CP1 and the λ/4 phase retardation layer RC1. The third adhesive member AP3 may be a pressure sensitive adhesive layer with a glass transition temperature from −35° C. to 0° C. inclusive, or an adhesive layer with a glass transition temperature from 40° C. to 150° C. inclusive. For the third adhesive member AP3, the same content as described with respect to the second adhesive member AP2 of FIG. 7A may be applied.

In the polarizing member PM-2 illustrated in FIG. 7B, the first adhesive member AP1 may be an adhesive layer with a glass transition temperature from 40° C. to 150° C. inclusive, and the second adhesive member AP2 and the third adhesive member AP3 may be pressure sensitive adhesive layers with a glass transition temperature from −35° C. to 0° C. inclusive, or adhesive layers with a glass transition temperatures from 40° C. to 150° C. inclusive. For example, one of the second adhesive member AP2 and the third adhesive member AP3 may be the pressure sensitive adhesive layer, and the other may be the adhesive layer. Alternatively, both the second adhesive member AP2 and the third adhesive member AP3 may be the adhesive layers, or both the second adhesive member AP2 and the third adhesive member AP3 may be the pressure sensitive adhesive layers.

Figure 7C:
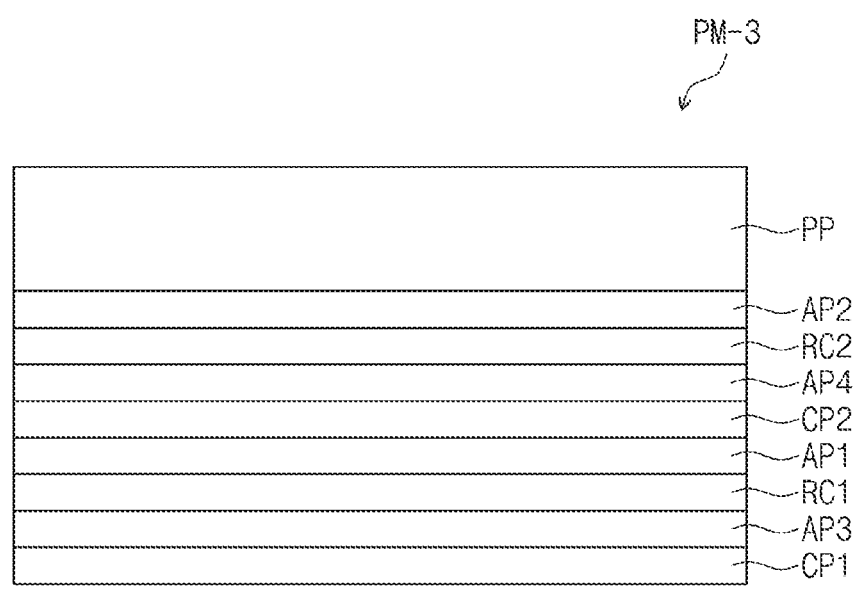
Figure 7C:
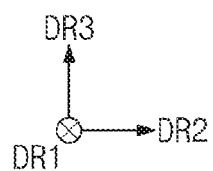

The polarizing member PM-3 included in an embodiment illustrated in FIG. 7C may further include a second optical compensation layer CP2 and a fourth adhesive member AP4 when compared with the polarizing member PM-2 in FIG. 7B. The second optical compensation layer CP2 may be disposed on a lower surface of the λ/2 phase retardation layer RC2. The second optical compensation layer CP2 may be disposed between the λ/4 phase retardation layer RC1 and the λ/2 phase retardation layer RC2. The second optical compensation layer CP2 may be disposed between the first adhesive member AP1 and the λ/2 phase retardation layer RC2. The fourth adhesive member AP4 may be disposed between the second optical compensation layer CP2 and the λ/2 phase retardation layer RC2. The fourth adhesive member AP4 may bond the second optical compensation layer CP2 and the λ/2 phase retardation layer RC2 together. The fourth adhesive member AP4 may be an adhesive layer with a glass transition temperature from 40° C. to 150° C. inclusive.

The second optical compensation layer CP2 may be disposed on the lower surface of the λ/2 phase retardation layer RC2 so as to compensate for the phase retardation value Rth in the thickness direction of the λ/2 phase retardation layer RC2. The second optical compensation layer CP2 may be a C-plate. The second optical compensation layer CP2 may be a negative C-plate or a positive C-plate. For example, when the λ/2 phase retardation layer RC2 has a phase retardation value Rth in the thickness direction with a negative value, the second optical compensation layer CP2 may be the positive C-plate, and when the λ/2 phase retardation layer RC2 has a phase retardation value Rth in the thickness direction with a positive value, the second optical compensation layer CP2 may be the negative C-plate. The second optical compensation layer CP2 may be a form of a solidified layer or a cured layer of a liquid crystal composition including a liquid crystal compound.

In the polarizing member PM-3 illustrated in FIG. 7C, the first adhesive member AP1 and the fourth adhesive member AP4 may be adhesive layers with a glass transition temperature from 40° C. to 150° C. inclusive, and the second adhesive member AP2 and the third adhesive member AP3 may be pressure sensitive adhesive layers with a glass transition temperature from −35° C. to 0° C. inclusive, or adhesive layers with a glass transition temperature from 40° C. to 150° C. inclusive. For example, one of the second adhesive member AP2 and the third adhesive member AP3 may be the pressure sensitive adhesive layer, and the other may be the adhesive layer. Alternatively, both the second adhesive member AP2 and the third adhesive member AP3 may be the adhesive layers, or both the second adhesive member AP2 and the third adhesive member AP3 may be the pressure sensitive adhesive layers.

Figure 8:
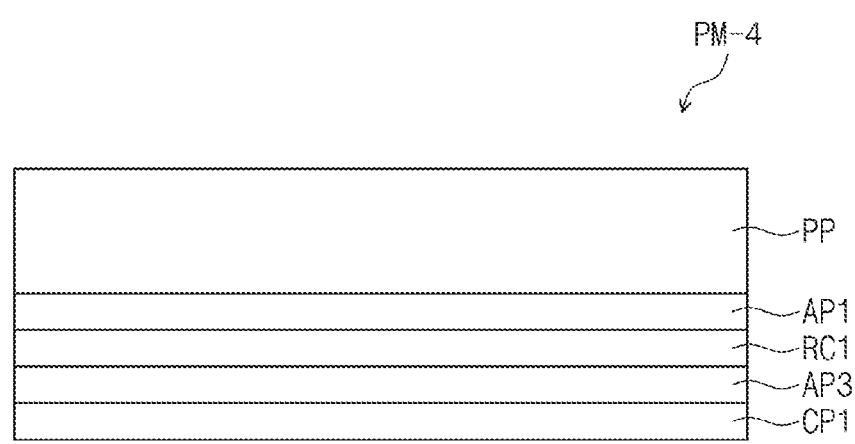

The polarizing member PM-4 illustrated in FIG. 8 may include the first optical compensation layer CP1, the λ/4 phase retardation layer RC1, and the linear polarizer PP. The polarizing member PM-4 illustrated in FIG. 8 may not be provided with the λ/2 phase retardation layer RC2 and the second adhesive member AP2, as compared with the polarizing member PM-2 of FIG. 7B. That is, referring to FIG. 8, the first optical compensation layer CP1 may be disposed most adjacent to the display panel DP (see, e.g., FIG. 1B), and may be disposed on a lower surface of the λ/4 phase retardation layer RC1. The third adhesive member AP3 may be disposed between the first optical compensation layer CP1 and the λ/4 phase retardation layer RC1.

The first optical compensation layer CP1 may be a C-plate for compensating for the phase retardation value Rth in the thickness direction of the λ/4 phase retardation layer RC1. The first optical compensation layer CP1 may be a negative C-plate or a positive C-plate. For example, when the λ/4 phase retardation layer RC1 has a phase retardation value Rth in the thickness direction with a negative value, the first optical compensation layer CP1 may be the positive C-plate, and when the λ/4 phase retardation layer RC1 has a phase retardation value Rth in the thickness direction with a positive value, the first optical compensation layer CP1 may be the negative C-plate. The first optical compensation layer CP1 may be a form of a solidified layer or a cured layer of a liquid crystal composition including a liquid crystal compound.

The third adhesive member AP3 may be an adhesive member for bonding the first optical compensation layer CP1 and the λ/4 phase retardation layer RC1 together. Accordingly, the polarizing member PM-4 may include the first optical compensation layer CP1, the third adhesive member AP3, the λ/4 phase retardation layer RC1, the first adhesive member AP1, and the linear polarizer PP sequentially laminated in the third direction DR3. The third adhesive member AP3 may be a pressure sensitive adhesive layer with a glass transition temperature from −35° C. to 0° C. inclusive, or an adhesive layer with a glass transition temperature from 40° C. to 150° C. inclusive. For the first optical compensation layer CP1 and the third adhesive member AP3, the description provided in association with FIGS. 7A to 7C may be applied.

For the polarizing member PM included in a flexible display apparatus (e.g., flexible display apparatus DD), such as the polarizing members illustrated in FIGS. 6, 7A to 7C, and 8, deformation of the λ/4 phase retardation layer RC1 may be prevented (or at least reduced) by forming the first adhesive member AP1 adjacent to the λ/4 phase retardation layer RC1 with an adhesive layer with a glass transition temperature from 40° C. to 150° C. inclusive such that the first adhesive member AP1 functions as a supporting layer for the λ/4 phase retardation layer RC1 when the flexible display apparatus is folded or bent. In this manner, there may be an effect of improved display quality of a flexible display apparatus because the λ/4 phase retardation layer RC1 may maintain optical properties irrespective of the operating conditions of the flexible display apparatus.

Figure 9:
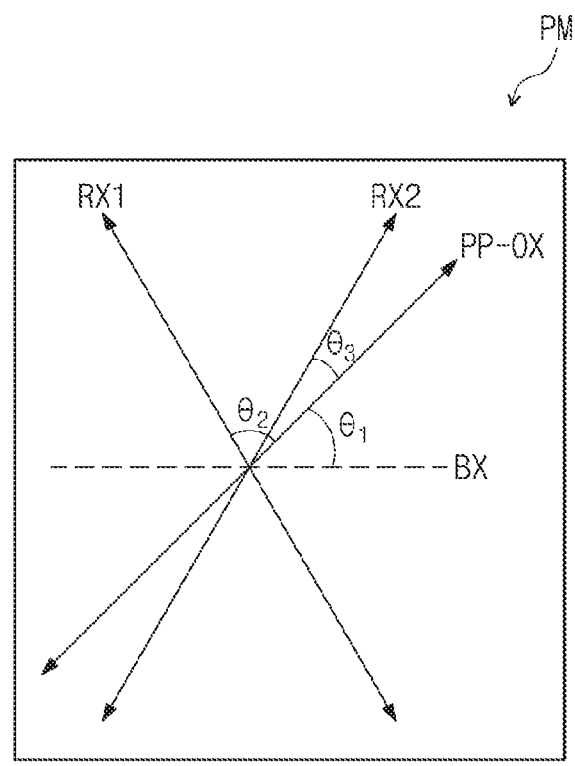
FIG. 9 illustrates a relationship between optical axes of optical members included in a polarizing member according to one or more exemplary embodiments.

FIG. 9 illustrates a relationship between optical axes of optical members included in a polarizing member according to one or more exemplary embodiments.

For instance, FIG. 9 schematically illustrates a relationship between optical axes of the linear polarizer PP, the λ/4 phase retardation layer RC1, and the λ/2 phase retardation layer RC2 in the polarizing member PM-1. FIG. 9 illustrates a relationship between an absorption axis PP-OX of the linear polarizer PP, a first optical axis RX1 of the λ/4 phase retardation layer RC1, and a second optical axis RX2 of the λ/2 phase retardation layer RC2 when viewed in a plan view, e.g., when viewed in the third direction DR3. In other words, FIG. 9 illustrates the relationship between the absorption axis PP-OX of the linear polarizer PP, the first optical axis RX1 of the λ/4 phase retardation layer RC1, and the second optical axis RX2 of the λ/2 phase retardation layer RC2 projected onto a plane parallel to a plane defined by the axis of the first direction DR1 and the axis of the second direction DR2. For example, the plane parallel to the plane defined by the axis of the first direction DR1 and the axis of the second direction DR2 in FIG. 9 may be parallel to the display panel DP.

The first optical axis RX1 of the λ/4 phase retardation layer, and the second optical axis RX2 of the λ/2 phase retardation layer may respectively represent slow axes of the λ/4 phase retardation layer RC1 (see FIG. 7A), and the λ/2 phase retardation layer RC2 (see, e.g., FIG. 7A).

In one or more exemplary embodiments, an angle θ1 between the absorption axis PP-OX of the linear polarizer PP and the bending axis BX may be 45±30 degrees. An angle θ2 between the absorption axis PP-OX of the linear polarizer PP and the first optical axis RX1 of the λ/4 phase retardation layer RC1 may be 75±30 degrees. Additionally, an angle θ3 between the absorption axis PP-OX of the linear polarizer PP and the second optical axis RX2 of the λ/2 phase retardation layer RC2 may be 15±13 degrees. For example, θ1 may be 45 degrees, θ2 may be 75 degrees, and θ3 may be 15 degrees. Additionally, an angle between the first optical axis RX1 of the λ/4 phase retardation layer RC1 and the second optical axis RX2 of the λ/2 phase retardation layer RC2 may be 60±30 degrees. For example, the angle between the first optical axis RX1 and the second optical axis RX2 may be 60 degrees.

Furthermore, FIG. 9 is illustrated about the bending axis BX as an example of the flexible display apparatus DD illustrated in FIG. 1A, but the illustration may also be applied to the bending axes BX1 and BX2 illustrated in FIG. 4B in the same way. In FIG. 9, the absorption axis PP-OX is illustrated, by way of example, to have revolved counterclockwise with respect to the bending axis BX, but is not limited thereto or thereby. For example, the absorption axis PP-OX may revolve clockwise with respect to the bending axis BX, and, also in this case, the angle θ1 between the absorption axis PP-OX and the bending axis BX may be 45±30 degrees. In other words, the angle θ1 between the absorption axis PP-OX and the bending axis BX may have a value between 15 degrees and 75 degrees, and for instance, may have 45 degrees.

The absorption axis PP-OX of the linear polarizer PP and the bending axis BX are illustrated to have an angle therebetween of 45±30 degrees in FIG. 9, but exemplary embodiments are not limited thereto or thereby. For example, the absorption axis PP-OX of the linear polarizer PP and the bending axis BX may correspond, or may be perpendicular to each other when viewed in a plane. For instance, the angle θ1 between the absorption axis PP-OX of the linear polarizer PP and the bending axis BX may be 0±30 degrees or 90±30 degrees.

When the angle θ1 between the absorption axis PP-OX and the bending axis BX is 0 degrees, the transmission axis (not illustrated) of the linear polarizer PP perpendicular to the absorption axis PP-OX may be perpendicular to the bending axis BX, and a bending motion may break molecular binding in a direction of the transmission axis (not illustrated), thereby causing a crack. Alternatively, when the angle θ1 between the absorption axis PP-OX and the bending axis BX is 90 degrees, the probability is relatively reduced that the molecular binding in the direction of the transmission axis (not illustrated) is broken, but wearing polarized sunglasses, or the like may cause a phenomenon that an image is not viewed at a specific position to occur, and additionally a phenomenon may occur that the linear polarizer PP is physically torn in the direction of the transmission axis (not illustrated). According to one or more exemplary embodiments, the angle θ1 between the absorption axis PP-OX and the bending axis BX has a value from 15 degrees to 75 degrees inclusive, and as such, bending properties may be further improved. In addition, the phenomenon that the molecular binding in the direction of the transmission axis (not illustrated) is broken, the phenomenon that the linear polarizer PP is physically torn in the direction of the transmission axis (not illustrated), and the phenomenon that an image is not viewed at a specific position when wearing polarized sunglasses, or the like, may be decreased.

The relationship between the absorption axis PP-OX of the linear polarizer PP, the first optical axis RX1, and the second optical axis RX2 is illustrated in FIG. 9, but exemplary embodiments are not limited thereto or thereby. For example, the same relationship may be applied also between the transmission axis (not illustrated) of the linear polarizer PP, the first optical axis RX1, and the second optical axis RX2. For instance, an angle between the transmission axis (not illustrated) of the linear polarizer PP, and the first optical axis RX1 of the λ/4 phase retardation layer RC1 may be 75±30 degrees. In addition, an angle between the transmission axis (not illustrated) of the linear polarizer PP, and the second optical axis RX2 of the λ/2 phase retardation layer RC2 may be 15±13 degrees. Additionally, an angle between the transmission axis (not illustrated) of the linear polarizer PP, and the bending axis BX may be 45±30 degrees. For instance, the angle between the transmission axis (not illustrated) of the linear polarizer PP and the bending axis BX may be 45 degrees, the angle between the transmission axis (not illustrated) of the linear polarizer PP and the first optical axis RX1 may be 75 degrees, and the angle between the transmission axis (not illustrated) of the linear polarizer PP and the second optical axis RX2 may be 15 degrees.

When the polarizing member PM includes the linear polarizer PP and the λ/4 phase retardation layer RC1, but does not include the λ/2 phase retardation layer RC2 as illustrated in FIG. 6, the angle θ2 between the absorption axis PP-OX of the linear polarizer PP, and the first optical axis RX1 of the λ/4 phase retardation layer RC1 may be 45±30 degrees when viewed in a plane. Additionally, the angle θ2 between the transmission axis (not illustrated) of the linear polarizer PP and the first optical axis RX1 of the λ/4 phase retardation layer RC1 may be 45±30 degrees. For example, the angle θ2 between the absorption axis PP-OX or the transmission axis (not illustrated) of the linear polarizer PP and the first optical axis RX1 of the λ/4 phase retardation layer RC1 may be 45 degrees.

Table 1 shows results of a folding test for a flexible display apparatus of an exemplary embodiment. A polarizing member PM used for the folding test has a structure of the polarizing member PM-1 illustrated in FIG. 7A. Comparative Example in Table 1 includes a polarizing member PM-1 in which all of two adhesive members AP1 and AP2 (see FIG. 7A) are pressure sensitive adhesive layers with a glass transition temperature from −35° C. to 0° C. inclusive. Embodiment 1 includes a polarizing member PM-1 in which the first adhesive member AP1 (see FIG. 7A) is an adhesive layer with a glass transition temperature from 40° C. to 150° C. inclusive, and the second adhesive member AP2 (see FIG. 7A) is a pressure sensitive adhesive layer with a glass transition temperature from −35° C. to 0° C. inclusive. Embodiment 2 includes a polarizing member PM-1 in which all of the first adhesive member AP1 (see FIG. 7A) and the second adhesive member AP2 (see FIG. 7A) are adhesive layers with a glass transition temperature from 40° C. to 150° C. inclusive.

Additionally, "in-folding" condition of "test condition" represents a state that the flexible display apparatus DD is folded as illustrated in FIG. 2A, and "out-folding" condition represents a state that the flexible display apparatus DD is folded as illustrated in FIG. 3A. It is to also noted that "high temperature, high humidity" condition means that the folding test is performed under the condition of a temperature of 60° C. and a relative humidity of 93%. Each of 2R, 3R, and 4R in Table 1 represents a radius of curvature in the bending area of the flexible display apparatus, and 2R, 3R, and 4R represent test conditions for the cases that the radii of curvature BR are respectively 2 mm, 3 mm, and 4 mm in FIG. 2A or FIG. 3A.

TABLE 1

| Test Condition | | | Comparative Example | Embodiment 1 | Embodiment 2 |
|---|---|---|---|---|---|
| In-folding | Room temperature | 4R | OK | OK | OK |
| | | 3R | NG | OK | OK |
| | | 2R | NG | OK | OK |
| | High temperature, high humidity | 4R | NG | OK | OK |
| | | 3R | NG | OK | OK |
| | | 2R | NG | OK | OK |
| Out-folding | Room temperature | 4R | NG | OK | OK |
| | | 3R | NG | OK | OK |
| | | 2R | NG | NG | OK |
| | High temperature, high humidity | 4R | NG | OK | OK |
| | | 3R | NG | OK | OK |
| | | 2R | NG | NG | OK |

In the test results of Table 1, "NG" represents a case that a crease has occurred in the phase retardation layer under the folding test conditions, and "OK" represents a case that a crease has not occurred in the phase retardation layer under the folding test conditions. In other words, "NG" represents a case that a crease has occurred in the phase retardation layer included in the polarizing member, and thus, display quality of the flexible display apparatus deteriorates, and "OK" represents a case that the display quality of the flexible display apparatus is satisfactory.

Referring to the test results of Table 1, it is known that Embodiment 1 and Embodiment 2, in which the first adhesive member AP1 adjacent to the λ/4 phase retardation layer RC1 is composed of an adhesive layer with a glass transition temperature from 40° C. to 150° C. inclusive, show satisfactory folding test results when compared with Comparative Example in which the first adhesive member AP1 is a pressure sensitive adhesive layer with a glass transition temperature from −35° C. to 0° C. inclusive. In other words, it may be confirmed that, in the case of the first adhesive member AP1 is composed of the adhesive layer with a glass transition temperature from 40° C. to 150° C. inclusive, a crease does not occur in the phase retardation layer RC1/RC2 even under high temperature, high humidity conditions as well as at room temperature, thereby resulting in satisfactory adhesive properties and display quality.

It may also be confirmed that Embodiment 2, in which all of the first adhesive member AP1 and the second adhesive member AP2 are composed of the adhesive layers with a glass transition temperature from 40° C. to 150° C. inclusive, shows satisfactory adhesive properties and display quality under all conditions irrespective of radius of curvature.

According to one or more exemplary embodiments, a flexible display apparatus may obtain improved display quality by including the polarizing member PM having the linear polarizer PP and the λ/4 phase retardation layer RC1 that have been laminated so as to reduce external light reflection. In one or more exemplary embodiments, display quality may be improved because deformation of the polarizing member PM may be minimized (or at least reduced) even when the flexible display apparatus is bent or folded, by forming the adhesive member adjacent to the λ/4 phase retardation layer RC1 of the polarizing member with the adhesive layer with a glass transition temperature from 40° C. to 150° C. inclusive. In other words, the flexible display apparatus may use the polarizing member PM including the adhesive member that is the adhesive layer with a glass transition temperature from 40° C. to 150° C. inclusive so that occurrence of a crease or a crack in the λ/4 phase retardation layer RC1 included in the polarizing member PM may be reduced when the flexible display apparatus is bent or folded, and thus, change of an optical compensation value may be reduced in the bending area, thereby improving display quality.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A flexible display apparatus comprising:
   a display panel; and
   a polarizing structure disposed on the display panel,
   wherein the polarizing structure comprises:
   a λ/4 phase retardation layer;
   a linear polarizer disposed on the λ/4 phase retardation layer;
   a λ/2 phase retardation layer disposed between the λ/4 phase retardation layer and the linear polarizer;
   a first adhesive structure disposed between the λ/4 phase retardation layer and the λ/2 phase retardation layer, the first adhesive structure being an adhesive layer with a glass transition temperature that is greater than or equal to 40° C. and less than or equal to 150° C.; and
   a second adhesive structure disposed between the λ/2 phase retardation layer and the linear polarizer in direct contact with the linear polarizer, the second adhesive structure being an adhesive layer with a glass transition temperature that is greater than or equal to −35° C. and less than or equal to 0° C.

2. The flexible display apparatus of claim 1, wherein a thickness of the first adhesive structure is greater than or equal to 0.1 μm and less than or equal to 5 μm.

3. The flexible display apparatus of claim 1, wherein:
   the first adhesive structure comprises an ultraviolet curable adhesive; and
   the second adhesive structure comprises a pressure sensitive adhesive.

4. The flexible display apparatus of claim 1, wherein the λ/4 phase retardation layer is a liquid crystal coating layer.

5. The flexible display apparatus of claim 1, wherein a thickness of the λ/4 phase retardation layer is greater than or equal to 0.5 μm and less than or equal to 5 μm.

6. The flexible display apparatus of claim 1, further comprising:
   a first optical compensation layer disposed between the display panel and the λ/4 phase retardation layer; and
   a third adhesive structure disposed between the first optical compensation layer and the λ/4 phase retardation layer,
   wherein the third adhesive structure is:
   a pressure sensitive adhesive layer with a glass transition temperature that is greater than or equal to −35° C. and less than or equal to 0° C.; or
   an adhesive layer with a glass transition temperature that is greater than or equal to 40° C. and less than or equal to 150° C.

7. The flexible display apparatus of claim 6, further comprising:
   a second optical compensation layer disposed between the λ/4 phase retardation layer and the λ/2 phase retardation layer; and
   a fourth adhesive structure disposed between the second optical compensation layer and the λ/2 phase retardation layer,
   wherein the fourth adhesive structure is an adhesive layer with a glass transition temperature that is greater than or equal to 40° C. and less than or equal to 150° C.

8. The flexible display apparatus of claim 7, wherein each of the first optical compensation layer and the second optical compensation layer is a positive C-plate or a negative C-plate.

9. The flexible display apparatus of claim 7, wherein:
   the λ/4 phase retardation layer is a nematic liquid crystal coating layer; and
   the λ/2 phase retardation layer is a discotic liquid crystal coating layer.

10. The flexible display apparatus of claim 1, wherein, in a plan view, an angle between an absorption axis or a transmission axis of the linear polarizer and a first optical axis of the λ/4 phase retardation layer is 45 degrees±30 degrees.

11. The flexible display apparatus of claim 1, wherein, in a plan view:
   an angle between an absorption axis or a transmission axis of the linear polarizer and a first optical axis of λ/4 phase retardation layer is 75 degrees±30 degrees; and
   an angle between the absorption axis or the transmission axis and a second optical axis of the λ/2 phase retardation layer is 15 degrees±13 degrees.

12. The flexible display apparatus of claim 1, wherein, in a plan view, an angle between a first optical axis of the λ/4 phase retardation layer and a second optical axis of the λ/2 phase retardation layer is 60 degrees±30 degrees.

13. The flexible display apparatus of claim 1, wherein:
   in a first mode, the display panel and the polarizing structure are bent with respect to a bending axis such that the polarizing structure is disposed closer to the bending axis than the display panel; and
   in a second mode, the display panel and the polarizing structure are unfolded.

14. The flexible display apparatus of claim 1, wherein:
   in a third mode, the display panel and the polarizing structure are bent with respect to a bending axis such that the display panel is disposed closer to the bending axis than the polarizing structure; and
   in a fourth mode, the display panel and the polarizing structure are unfolded.

15. The flexible display apparatus of claim 1, wherein:
   the flexible display apparatus comprises a bending area and a non-bending area; and
   the bending area is bent from one side of the non-bending area.

16. The flexible display apparatus of claim 15, wherein a radius of curvature of the bending area is greater than 0 mm and less than or equal to 5 mm.

17. The flexible display apparatus of claim 1, further comprising:
   a touch sensing structure disposed on the display panel,
   wherein the touch sensing structure is disposed on an upper surface or a lower surface of the polarizing structure.

18. A flexible display apparatus comprising:
   a display panel comprising a bending area that is transformable into a bent shape or has a bent shape with respect to a bending axis extending in one direction; and
   a polarizing structure disposed on the display panel,
   wherein the polarizing structure comprises:
   a first phase retardation layer including a liquid crystal coating layer;
   a linear polarizer disposed on the first phase retardation layer;
   a second phase retardation layer including a liquid crystal coating layer disposed between the first phase retardation layer and the linear polarizer;
   a first adhesive structure with a glass transition temperature that is greater than or equal to 40° C. and less than or equal to 150° C., and disposed between the first phase retardation layer and the second phase retardation layer; and
   a second adhesive structure with a glass transition temperature that is greater than or equal to −35° C. and less than or equal to 0° C., and disposed directly between the second phase retardation layer and the linear polarizer,
   wherein the first and second phase retardation layers are a λ/4 phase retardation layer and λ/2 phase retardation layer.

* * * * *